US012040701B2

(12) United States Patent
Chu et al.

(10) Patent No.: US 12,040,701 B2
(45) Date of Patent: *Jul. 16, 2024

(54) CASCADED ACTIVE ELECTRO-MAGNETIC INTERFERENCE FILTER

(71) Applicant: TEXAS INSTRUMENTS INCORPORATED, Dallas, TX (US)

(72) Inventors: Yongbin Chu, Plano, TX (US); Yogesh Ramadass, San Jose, CA (US); Saurav Bandyopadhyay, Dallas, TX (US); Todd Allen Toporski, Northville, MI (US); Jeffrey Anthony Morroni, Parker, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/989,971

(22) Filed: Aug. 11, 2020

(65) Prior Publication Data

US 2020/0373831 A1 Nov. 26, 2020

Related U.S. Application Data

(63) Continuation of application No. 15/715,708, filed on Sep. 26, 2017, now Pat. No. 10,778,089.

(60) Provisional application No. 62/482,930, filed on Apr. 7, 2017.

(51) Int. Cl.
*H02M 1/44* (2007.01)
*H02M 1/12* (2006.01)
*H02M 1/15* (2006.01)
*H05K 9/00* (2006.01)

(52) U.S. Cl.
CPC ............... *H02M 1/44* (2013.01); *H02M 1/12* (2013.01); *H02M 1/15* (2013.01); *H05K 9/0071* (2013.01)

(58) Field of Classification Search
CPC .......... H02M 1/12; H02M 1/143; H02M 1/15; H02M 1/44; H05K 9/0071
See application file for complete search history.

(56) References Cited

U.S. PATENT DOCUMENTS 4,551,636 A * 11/1985 Andrews ................. G01R 15/08
326/62
4,667,279 A * 5/1987 Maier ...................... H02M 1/15
363/90
4,736,152 A * 4/1988 Albach ................... H02M 1/15
323/233

(Continued)

OTHER PUBLICATIONS

Narayanasamy et al. ("High density EMI mitigation solution using active approaches", 2017 IEEE International Symposium on Electromagnetic Compatibility) (Year: 2017).

*Primary Examiner* — Yusef A Ahmed
(74) *Attorney, Agent, or Firm* — Frank D. Cimino

(57) ABSTRACT

An active electromagnetic interference (EMI) filter includes a first amplifier and a second amplifier. The first amplifier is configured to sense noise signals on a power conductor. The second amplifier is coupled to the first amplifier and is configured to drive a cancellation signal onto the power conductor. The cancellation signal is to reduce the amplitude of the noise signals sensed by the first amplifier. An output impedance of the second amplifier is lower than an output impedance of the first amplifier.

26 Claims, 3 Drawing Sheets

(56) References Cited

U.S. PATENT DOCUMENTS

| | | | | |
|---|---|---|---|---|
| 4,801,889 | A | * | 1/1989 | Fujisawa .................. H03F 3/68 330/84 |
| 4,878,244 | A | * | 10/1989 | Gawargy ............... H04B 1/586 379/378 |
| 4,952,867 | A | * | 8/1990 | Anderson ............ H04R 25/356 330/288 |
| 5,450,622 | A | * | 9/1995 | Vandegraaf ............ H03G 3/344 455/220 |
| 5,452,086 | A | * | 9/1995 | Bunn ................. G01D 5/35303 250/227.12 |
| 5,614,828 | A | * | 3/1997 | Sims .................... G01R 31/006 324/402 |
| 5,635,871 | A | * | 6/1997 | Cavigelli ................ H03F 1/083 330/294 |
| 5,668,464 | A | * | 9/1997 | Krein ...................... G05F 1/565 363/46 |
| 5,732,143 | A | * | 3/1998 | Andrea ............ G10K 11/17873 381/71.7 |
| 5,748,130 | A | | 5/1998 | Wicnienski |
| 5,889,393 | A | * | 3/1999 | Wrathall ................. G05F 1/565 323/280 |
| 6,178,101 | B1 | * | 1/2001 | Shires ................... H02M 1/44 363/39 |
| 6,208,134 | B1 | * | 3/2001 | Demma ................. G01B 7/023 324/207.26 |
| 6,246,221 | B1 | * | 6/2001 | Xi ........................... G05F 1/575 323/280 |
| 6,292,501 | B1 | * | 9/2001 | DuBose ................. H01S 5/042 327/554 |
| 6,513,383 | B1 | * | 2/2003 | Okano ............... B60R 21/0133 73/514.34 |
| 7,019,503 | B1 | * | 3/2006 | Ortiz .................. H02M 1/4225 363/81 |
| 7,038,435 | B2 | * | 5/2006 | Ortiz .................... H02M 3/156 363/81 |
| 7,233,130 | B1 | * | 6/2007 | Kay ...................... H02M 1/143 323/284 |
| 7,856,289 | B2 | * | 12/2010 | Schanin ................. G07F 9/105 221/9 |
| 8,704,074 | B1 | * | 4/2014 | Liu .......................... G10H 3/22 84/728 |
| 8,810,249 | B2 | * | 8/2014 | Cehelnik ............... G06F 3/0443 324/688 |
| 8,823,448 | B1 | * | 9/2014 | Shen ...................... H04B 15/00 327/552 |
| 8,975,887 | B2 | | 3/2015 | Galbis |
| 9,583,090 | B2 | * | 2/2017 | Christoph ........ G10K 11/17815 |
| 9,671,469 | B2 | * | 6/2017 | Koduka ............... G01R 31/382 |
| 9,705,465 | B2 | * | 7/2017 | Bodnar ................... H03F 1/301 |
| 9,722,484 | B2 | * | 8/2017 | Stahl ...................... H02M 1/15 |
| 9,726,775 | B2 | * | 8/2017 | Lamesch ................ G01D 5/24 |
| 9,733,275 | B2 | * | 8/2017 | Deliwala .................. G01J 1/44 |
| 9,734,814 | B2 | * | 8/2017 | Christoph ........ G10K 11/17885 |
| 9,755,519 | B1 | * | 9/2017 | Huang ................... H03K 17/687 |
| 9,880,574 | B2 | * | 1/2018 | Morroni ............. H02M 3/1584 |
| 2002/0020225 | A1 | * | 2/2002 | Sakai ...................... G01F 1/325 73/861.22 |
| 2002/0105233 | A1 | | 8/2002 | Vice |
| 2004/0008527 | A1 | * | 1/2004 | Honda .................... H02M 1/12 363/39 |
| 2005/0237694 | A1 | * | 10/2005 | Kapusta ............... G11C 27/026 361/271 |
| 2006/0186955 | A1 | * | 8/2006 | Quilter ..................... H03F 1/32 330/10 |
| 2006/0280314 | A1 | * | 12/2006 | Okada .................... H03F 3/217 381/94.1 |
| 2008/0278229 | A1 | * | 11/2008 | Grundl ................. H03H 1/0007 327/559 |
| 2009/0123003 | A1 | * | 5/2009 | Sibbald ............ G10K 11/17853 381/71.14 |
| 2010/0142718 | A1 | * | 6/2010 | Chin ................ G10K 11/17885 381/71.8 |
| 2010/0301827 | A1 | * | 12/2010 | Chen ..................... H02M 3/156 323/299 |
| 2013/0027011 | A1 | * | 1/2013 | Shih ....................... G05F 1/467 323/282 |
| 2013/0207722 | A1 | * | 8/2013 | Bulzacchelli ........... H03F 3/195 330/260 |
| 2013/0328627 | A1 | * | 12/2013 | Krohn ................... A61B 5/6801 330/149 |
| 2014/0043871 | A1 | * | 2/2014 | Shen ....................... H02M 1/12 363/40 |
| 2014/0071719 | A1 | * | 3/2014 | Stahl ...................... H02M 1/15 363/44 |
| 2014/0292401 | A1 | * | 10/2014 | Shen .................... H03H 11/126 327/552 |
| 2015/0003124 | A1 | * | 1/2015 | Sakai ..................... H02M 1/08 363/44 |
| 2015/0041336 | A1 | * | 2/2015 | Chan ................... G01N 27/3274 205/792 |
| 2015/0061769 | A1 | * | 3/2015 | Bodnar .................. H03G 3/001 330/282 |
| 2015/0130436 | A1 | * | 5/2015 | Kanamori ............. H02M 3/158 323/282 |
| 2015/0145801 | A1 | * | 5/2015 | Angelini ................ G06F 3/0446 345/174 |
| 2015/0201277 | A1 | * | 7/2015 | Christoph ........ G10K 11/17875 381/71.1 |
| 2015/0249457 | A1 | * | 9/2015 | Miyake ................... H03M 1/56 341/158 |
| 2015/0263614 | A1 | * | 9/2015 | Bansal ................. H02M 3/1584 323/282 |
| 2015/0333712 | A1 | * | 11/2015 | Deliwala ............... A61B 5/0059 324/123 R |
| 2016/0025777 | A1 | * | 1/2016 | Deliwala .................. G01R 19/25 324/115 |
| 2016/0187386 | A1 | | 6/2016 | El-Damak et al. |
| 2016/0259353 | A1 | * | 9/2016 | Morroni ............. H02M 3/1584 |
| 2016/0334818 | A1 | * | 11/2016 | Singh ...................... G05F 1/56 |
| 2017/0077802 | A1 | * | 3/2017 | Wei ....................... H03F 1/083 |
| 2017/0153161 | A1 | * | 6/2017 | Yomoyama ........... G01L 23/222 |
| 2017/0207713 | A1 | * | 7/2017 | Luo ........................ H02M 1/15 |
| 2017/0345407 | A1 | * | 11/2017 | Christoph ........ G10K 11/17855 |
| 2019/0028027 | A1 | | 1/2019 | Cho |

\* cited by examiner

CASCADED ACTIVE ELECTRO-MAGNETIC INTERFERENCE FILTER

CROSS-REFERENCE TO RELATED APPLICATIONS

This application is a continuation of U.S. patent application Ser. No. 15/715,708, filed Sep. 26, 2017, which claims priority to U.S. Provisional Patent Application No. 62/482,930, filed Apr. 7, 2017, entitled "Cascaded Voltage Sense and Current Compensation (VSCC) Active EMI Filter (AEF) for EMI Noise Reduction," which is hereby incorporated herein by reference in its entirety for all purposes.

BACKGROUND

Switching power converters produce electromagnetic interference (EMI) at the converter switching frequency and harmonics thereof. The EMI may be injected onto conductors connecting the switching power converter to a power source, such as a battery, and affect other devices connected by the power source. To reduce the effects of EMI, an EMI filter may be connected to the power inputs of the switching power converter.

Passive and active type EMI filters are implemented in various applications. Passive EMI filters employ only passive components and can be large and expensive. Active EMI filters employ active components, and can be smaller and more cost effective than passive EMI filters.

SUMMARY

A cascaded active electromagnetic interference (EMI) filter that provides a substantial performance improvement over conventional active EMI filters is disclosed herein. In one embodiment, an active EMI filter includes a first amplifier and a second amplifier. The first amplifier is configured to sense noise signals on a power conductor. The second amplifier is coupled to the first amplifier and is configured to drive a cancellation signal onto the power conductor. The cancellation signal is to reduce the amplitude of the noise signals sensed by the first amplifier. An output impedance of the second amplifier is lower than an output impedance of the first amplifier.

In another embodiment, an EMI filter includes a sense amplifier and an injection amplifier. The sense amplifier is configured to sense noise on a power conductor, and to generate, based on sensed noise, a cancellation signal to counteract the sensed noise. The injection amplifier is coupled to the sense amplifier and is configured to inject the cancellation signal onto the power conductor. The impedance of the injection amplifier is lower than the impedance of the sense amplifier.

In a further embodiment, a switch mode power supply includes a switching DC-DC converter and an active EMI filter. The switching DC-DC converter is configured to convert an input voltage to an output voltage. The switching DC-DC converter receives the input voltage via a power conductor. The active EMI filter is coupled to the power conductor. The active EMI filter includes a sense amplifier and an injection amplifier. The sense amplifier is configured to sense noise on the power conductor, and to generate, based on sensed noise, a cancellation signal to counteract the sensed noise. A non-inverting input of the injection amplifier is coupled to an output of the sense amplifier. The injection amplifier is configured to inject the cancellation signal onto the power conductor. The output impedance of the injection amplifier is lower than the output impedance of the sense amplifier.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Conventional active electromagnetic interference (EMI) filters are generally implemented using a single amplifier stage. Because the amplifier output impedance is relatively high in such implementations, the additional passive components (e.g., inductors) needed to improve filter performance are usually of substantial size and cost. Embodiments of the active EMI filter disclosed herein provide improved performance relative to conventional single stage active EMI filters. The active EMI filter disclosed herein includes cascaded amplifiers that provide reduced output impedance relative to conventional single stage active EMI filters. The reduced output impedance results in improved noise cancellation and alleviates the need for large and costly passive filter components.

While embodiments are described herein with respect to reducing noise generated by a switch-mode power supply, such as a DC-DC converter, embodiments of the cascaded active EMI filter disclosed herein are applicable to noise suppression in a wide variety of applications, such as motor drives, class-D amplifiers, etc.

Figure 1:
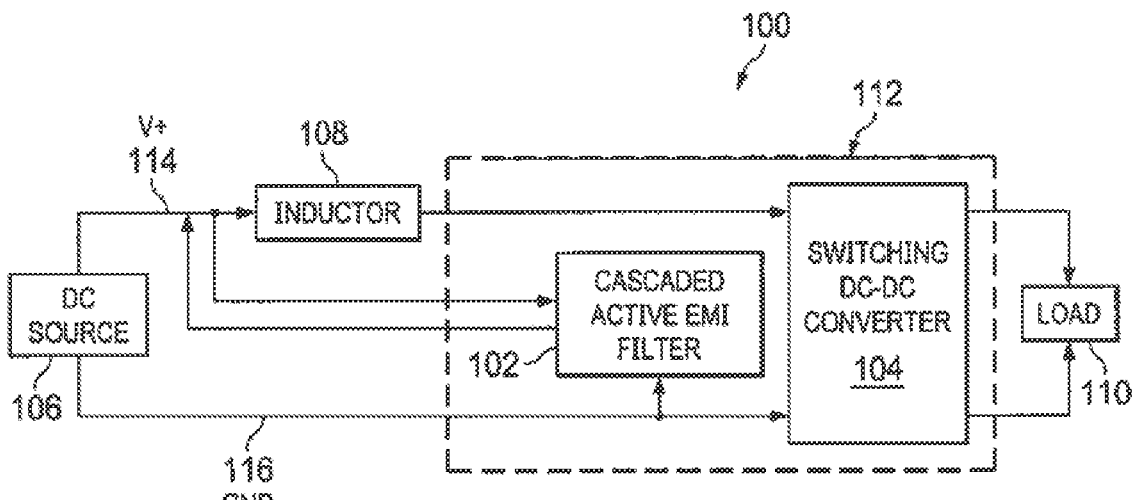
FIG. 1 shows a block diagram of a power system that includes a cascaded active electromagnetic interference (EMI) filter in accordance with various embodiments.

FIG. 1 shows a block diagram of a power system 100 that includes a cascaded active EMI filter 102 in accordance with various embodiments. The power system 100 also includes a switching DC-DC converter 104 and a DC power source 106. In various embodiments, the DC power source 106 is a battery, a fuel cell, a photovoltaic cell, a DC power supply, or other source of DC power. The switching DC-DC converter 104 converts power provided by the DC source 106 at a first voltage to a different output voltage. Power at the different output voltage is applied to a load 110, where the load 110 is any electric or electronic circuit that operates on DC power in various embodiments of the system 100. The switching DC-DC converter is coupled to the DC power source 106 via an inductor 108. In some embodiments, the inductor 108 has a value of 250-750 nanohenries.

The switching DC-DC converter 104 is a buck converter, a boost converter, a buck-boost converter, or other type of switch mode power supply that converts a DC voltage input to a different DC output voltage. The switching DC-DC converter 104 converts one voltage to another by switching input energy to a storage device, such as an inductor or capacitor, and releasing the stored energy to the output of the converter 104 at a predetermined different voltage. For example, an embodiment of the switching DC-DC converter 104 produces a 5 volt output from a 12 volt input. Switching in the DC-DC converter 104 generates noise on the inputs of the converter 104 and on the conductors (power conductors 114 and reference conductors 116) connecting the switching DC-DC converter 104 to the DC power source 106. The noise originating in the switching DC-DC converter 104 propagates to other systems and devices powered by the DC power source 106 (e.g., other devices coupled to the conductors 114 and 116).

The cascaded active EMI filter 102 is coupled to the power conductors 114 connecting the inductor 108 to the DC power source 106. The cascaded active EMI filter 102 is a voltage sense and current compensation filter that senses noise signal as voltage on the power conductors 114 connecting the inductor 108 to the DC power source 106, generates a cancellation signal based on the sensed noise voltage, and drives the cancellation signal (i.e., a current) onto the power conductors 114 to reduce the amplitude of the sensed noise voltage. In some embodiments, the cascaded active EMI filter 102 and the switching DC-DC converter 104 are housed in a common package 112, e.g., a common integrated circuit, such as a power supply controller integrated circuit, or a common power supply module package. The cascaded active EMI filter 102 allows the size of the inductor 108 and other filter components to be reduced relative to conventional EMI filter implementations. Accordingly, embodiments of the cascaded active EMI filter 102 allow the cost and size of the circuitry of the power system 100 to be reduced relative to conventional implementations.

Embodiments of the cascaded active EMI filter 102 may be applied in any application in which it is desirable to reduce the presence of noise on the output of the DC power source 106. For example, in automotive applications a variety of systems are powered by a battery that serves as the DC power source 106. The cascaded active EMI filter 102 may be applied to reduce the incidence of switching noise generated by the switching DC-DC converter 104 on the output of the battery, thereby reducing the amplitude of noise signals propagated to other automotive systems via the power conductors 114 and 116.

Figure 2:
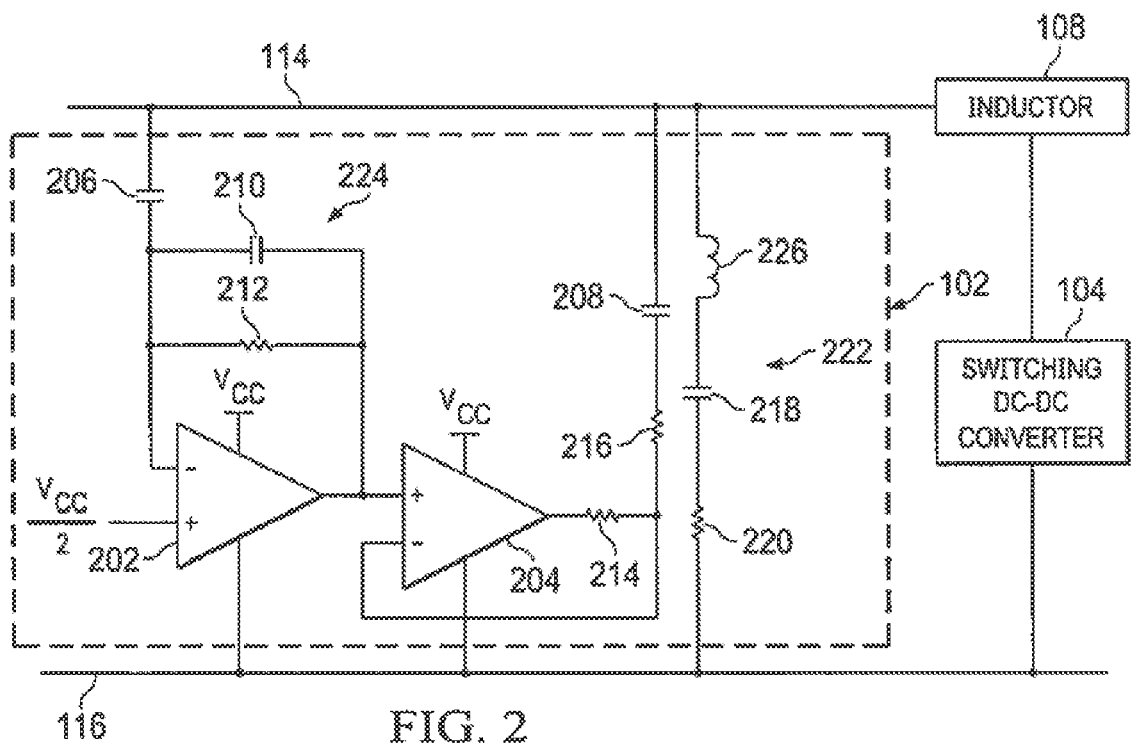
FIG. 2 shows a schematic diagram of a cascaded active EMI filter in accordance with various embodiments.

FIG. 2 shows a schematic diagram of a cascaded active EMI filter 102 in accordance with various embodiments. The cascaded active EMI filter 102 includes a sense amplifier 202 and an injection amplifier 204. The sense amplifier 202 and the injection amplifier 204 are implemented as operational amplifiers in some embodiments.

The sense amplifier 202 is AC coupled, via the capacitor 206, to the power conductors 114 that couple the DC power source 106 to the inductor 108. In some embodiments, the capacitor 206 has a value in a range of 25 nanofarads to 100 nanofarads. The sense amplifier 202 senses noise signal (e.g., noise voltage) on the power conductors 114, and generates a cancellation signal (e.g., an inverse of the detected noise signal) to be driven onto the power conductors to reduce the amplitude of the noise signal. The sense amplifier 202 provides high gain for the sensed noise signal to generate the cancellation signal. However, the output impedance of the sense amplifier 202 is relatively high at the frequencies of noise to be suppressed (e.g., the switching frequency of the switching DC-DC converter 104).

The sense amplifier 202 includes a feedback compensation network 224 that provides feedback from the output of the sense amplifier 202 to the inverting input of the sense amplifier 202. The feedback network 224 includes a resistor 212 for DC feedback and a capacitor 210 for AC feedback. The values of the resistor 212 and the capacitor 210 are selected to help stabilize low frequency operation of the sense amplifier 202. In some embodiments, the resistor 212 has a value in a range of 1 megohm to 20 mega-ohms and the capacitor 210 has a value in a range of 50 picofarads to 200 picofarads.

The injection amplifier 204 is AC coupled to the power conductors 114 via the capacitor 208, and provides a low impedance output suitable for driving the power conductors 114 with the cancellation signal generated by the sense amplifier 202. The output impedance and gain of the injection amplifier 204 are lower than the output impedance and gain of the sense amplifier 202. The non-inverting input of the injection amplifier 204 is coupled to the output of the sense amplifier 202 for reception of the cancellation signal. Some embodiments of the injection amplifier 204 are connected in a voltage follower configuration in which the output of the injection amplifier 204 is coupled to the inverting input of the injection amplifier 204.

Some embodiments of the active EMI filter 102 include compensation resistors 214 and 216 that couple the output of the injection amplifier 204 to the injection capacitor 208. The compensation resistor 214 also couples the output of the injection amplifier 204 to the inverting input of the injection amplifier 204. In some embodiments, the resistor 216 has a value of less than one ohm and the resistor 214 has a value in a range of 5 to 20 ohms.

Some embodiments of the active EMI filter 102 include a high frequency compensation network 222. The high frequency compensation network 222 includes a resistor 220 and a capacitor 218 connected in series across the conductors 114 and 116. In some embodiments, the resistor 220 has a value less than one ohm and the capacitor 218 has a value in a range of 50 nanofarads to 250 nanofarads. Some embodiments of the high frequency compensation network 222 include an inductor 226 in series with the capacitor 218 and the resistor 220.

Figure 3:
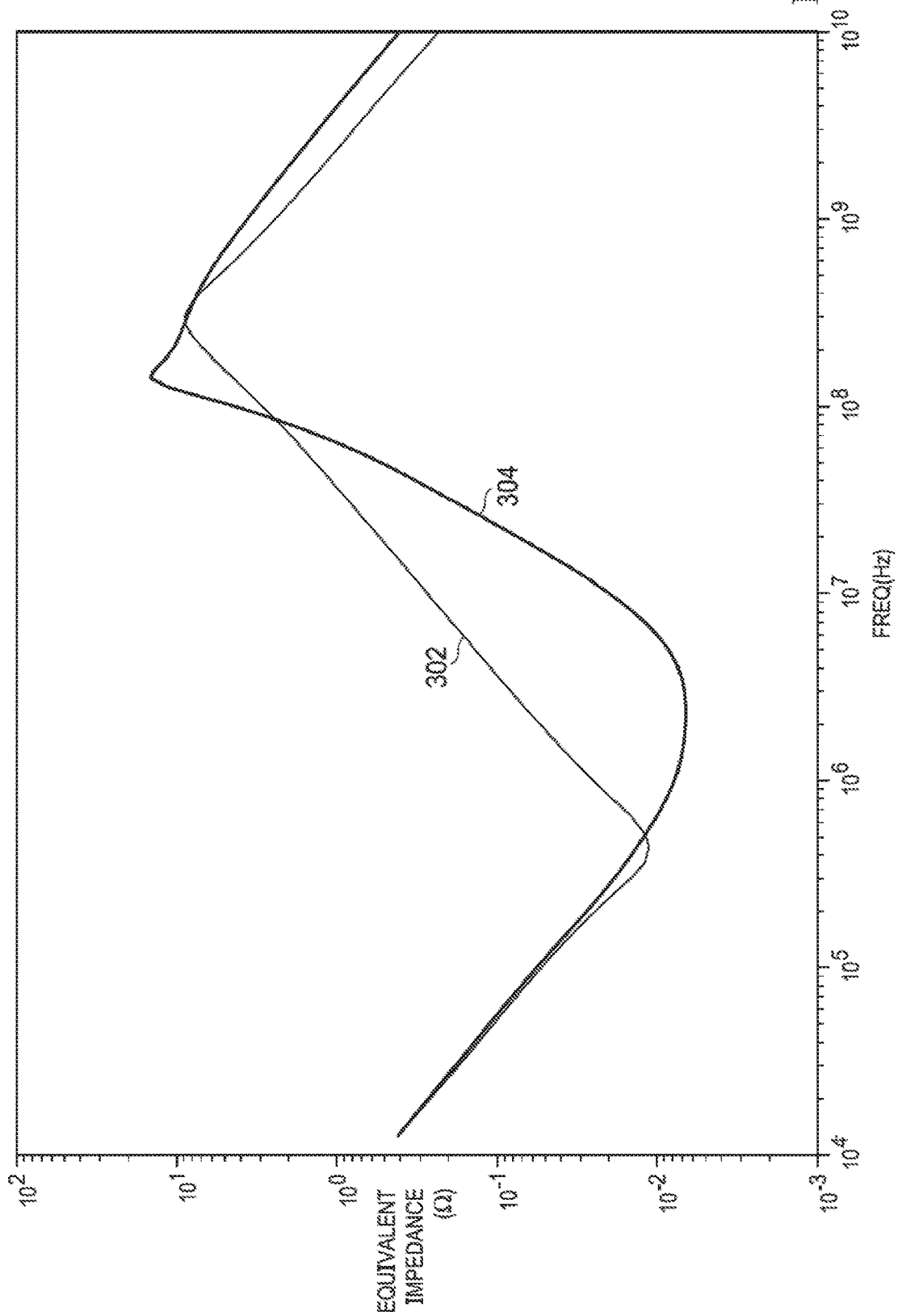
FIG. 3 shows equivalent impedance of a conventional single stage active EMI filter and equivalent impedance of the cascaded active EMI filter in accordance with various embodiments.

FIG. 3 shows equivalent impedance 302 of a conventional single stage active EMI filter and equivalent impedance 304 of the cascaded active EMI filter 102 in accordance with various embodiments. FIG. 3 shows that at a frequency of about 2 megahertz (e.g., the switching frequency of the switching DC-DC converter 104) the equivalent impedance 304 of the cascaded active EMI filter 102 is about one-tenth of the equivalent impedance 302 of the conventional single stage active EMI filter. By providing lower output impedance, embodiments of the cascaded active EMI filter 102 are able to more effectively reduce noise on the power conductors 114 and 116 that distribute power from the DC power source 106, and reduce the need for bulky and costly passive EMI filter components that are needed to reduce EMI noise below relevant EMI standards with conventional EMI filters.

Figure 4:
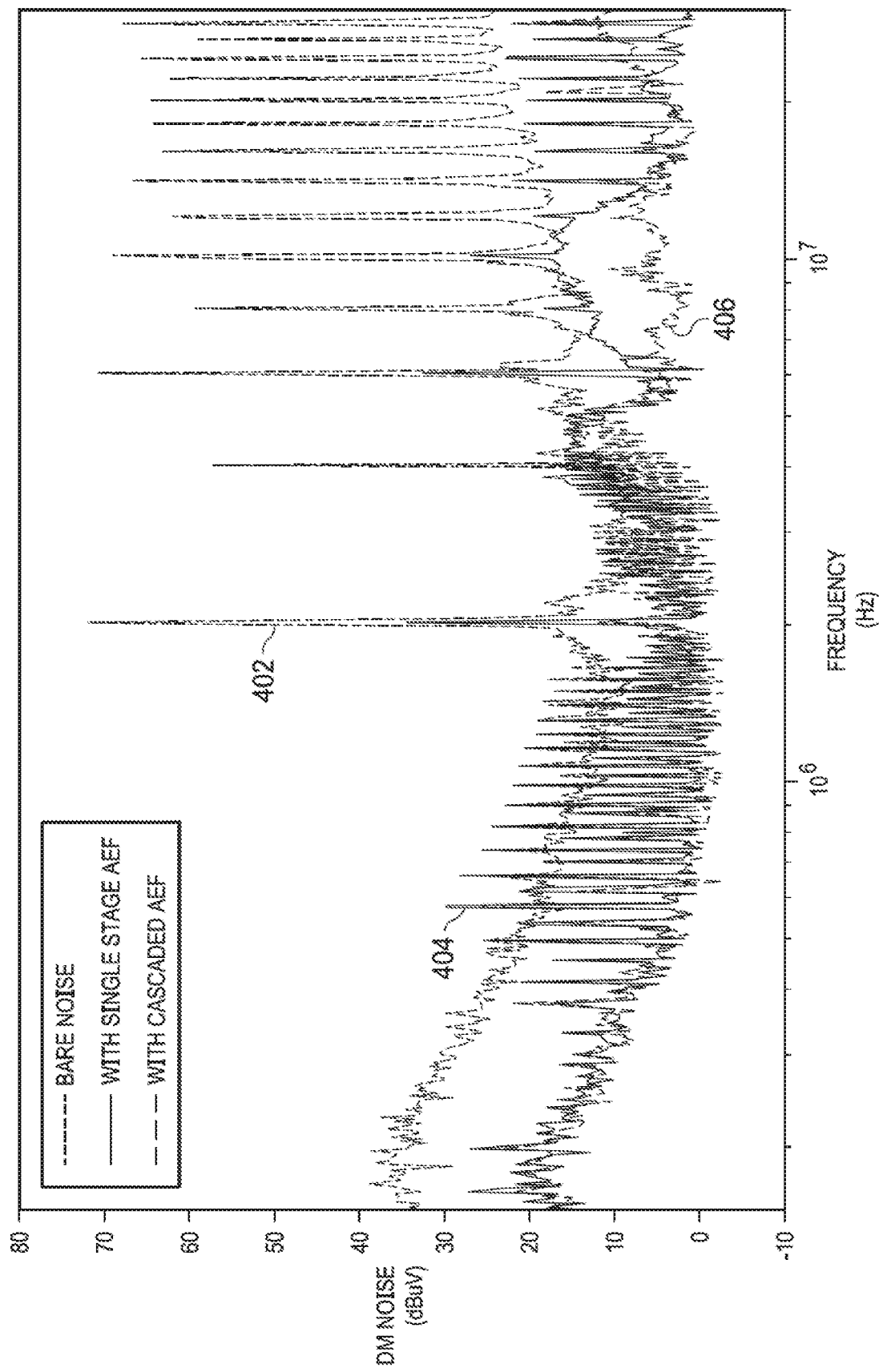
FIG. 4 shows performance of a conventional single stage active EMI filter and performance of a cascaded active EMI filter in accordance with various embodiments.

FIG. 4 shows a comparison of noise reduction provided by a conventional single stage active EMI filter to noise reduction provided by an embodiment of the cascaded active EMI filter 102. FIG. 4 shows amplitude of the raw unfiltered noise signal 402, amplitude of the noise 404 reduced by application of a conventional single stage active EMI filter, and amplitude of the noise 406 reduced by application of the cascaded active EMI filter 102. Peak noise is found at about 2 megahertz in FIG. 4. The noise signals 402, 404, and 406 are measured with line impedance stability networks, which is equipment typically used to measure EMI noise. FIG. 4 shows that relative to the conventional single stage active EMI filter, the cascaded active EMI filter 102 provides substantially greater reduction in the amplitude of the peak noise. For example, the cascaded active EMI filter 102 provides about 20 dB more reduction in noise amplitude (i.e., 10 times better performance) than is provided by the conventional single stage active EMI filter at 2 MHz.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A circuit comprising:
   a first amplifier having a reference input, an inverting input and an output, the inverting input of the first amplifier coupled to a conductor via alternating current (AC) coupling;
   a compensation network coupled between the inverting input and the output of the first amplifier;
   a voltage follower having a voltage follower input and a voltage follower output, the voltage follower including a second amplifier, the second amplifier having a non-inverting input, an inverting input, and an output, the inverting input of the second amplifier directly coupled to and tracks the voltage follower output, the output of the second amplifier coupled to the voltage follower output, and the non-inverting input of the second amplifier coupled to the output of the first amplifier via the voltage follower input, in which the voltage follower has a lower gain and a lower output impedance than the first amplifier; and
   an injection network including a capacitor and a resistor coupled between the voltage follower output and the conductor.

2. The circuit of claim 1, wherein the conductor is a first conductor, the compensation network is a first compensation network, and the circuit further comprises a second compensation network coupled between the first conductor and a second conductor.

3. The circuit of claim 2, wherein the capacitor is a first capacitor, the resistor is a first resistor, and the second compensation network includes a second capacitor coupled in series with a second resistor between the first conductor and the second conductor.

4. The circuit of claim 3, wherein the second compensation network further includes an inductor coupled in series with the second capacitor and the second resistor between the first and second conductors.

5. The circuit of claim 1, wherein the compensation network is configured to provide negative feedback to the first amplifier.

6. The circuit of claim 1, wherein the capacitor is a first capacitor, the resistor is a first resistor, and the compensation network comprises a second resistor and a second capacitor.

7. The circuit of claim 1, wherein the resistor is a first resistor, and the voltage follower includes a second resistor coupled between the output of the second amplifier and the voltage follower output.

8. The circuit of claim 1, wherein the resistor of the injection network is coupled between the capacitor and the inverting input of the second amplifier.

9. The circuit of claim 1, wherein the first amplifier and the voltage follower are integrated on an integrated circuit.

10. A circuit comprising:
    a sense amplifier having a reference input, an inverting input, and an output, the inverting input of the sense amplifier coupled to a conductor via AC coupling;
    a compensation network coupled between the inverting input and the output of the sense amplifier;
    a voltage follower having a voltage follower input and a voltage follower output, the voltage follower including an amplifier, the amplifier having a non-inverting input, an inverting input, and an output, the inverting input of the amplifier directly coupled to and tracks the voltage follower output, the output of the amplifier coupled to the voltage follower output, and the non-inverting input of the amplifier coupled to the output of the sense amplifier via the voltage follower input, in which the voltage follower has a lower gain and a lower output impedance than the sense amplifier, and
    an injection network including a capacitor and a resistor coupled between the voltage follower output and the conductor.

11. The circuit of claim 10, wherein the compensation network is a first compensation network, the conductor is a first conductor, and the circuit further comprises a second compensation network coupled between the first conductor and a second conductor.

12. The circuit of claim 11, wherein the resistor is a first resistor, the capacitor is a first capacitor, and the second compensation network includes a second capacitor coupled in series with a second resistor between the first and second conductors.

13. The circuit of claim 12, wherein the second compensation network further includes an inductor coupled in series with the second capacitor and the second resistor between the first and second conductors.

14. The circuit of claim 10, wherein the resistor is a first resistor, the conductor is a first conductor, the compensation network is a first compensation network, the capacitor is a first capacitor, and the circuit further comprises a second compensation network coupled between the first conductor and a second conductor,
    wherein the second compensation network includes a second capacitor coupled in series with a second resistor between the first conductor and the second conductor.

15. The circuit of claim 10, wherein the compensation network is configured to provide negative feedback to the sense amplifier.

16. The circuit of claim 10, wherein the sense amplifier and the voltage follower are integrated on an integrated circuit.

17. The circuit of claim 10, wherein the resistor is a first resistor, and the voltage follower includes a second resistor coupled between the output of the amplifier and the voltage follower output.

18. The circuit of claim 10, wherein the resistor of the injection network is coupled between the capacitor and the inverting input of the amplifier.

19. A circuit comprising:
- a first amplifier having a reference input, an inverting input and an output, the inverting input of the first amplifier coupled to a conductor via AC coupling;
- a compensation network coupled between the inverting input and the output of the first amplifier;
- a voltage follower having a voltage follower input and a voltage follower output, the voltage follower including a second amplifier, the second amplifier having a non-inverting input, an inverting input, and an output, the inverting input of the second amplifier directly coupled to and tracks the voltage follower output, the output of the second amplifier coupled to the voltage follower output, and the non-inverting input of the second amplifier coupled to the output of the first amplifier via the voltage follower input, in which the voltage follower has a lower gain and a lower output impedance than the first amplifier; and
- an injection network including a capacitor and a resistor coupled to the voltage follower output, the injection network configured to provide a cancellation signal.

20. The circuit of claim 19, wherein the injection network is coupled to the conductor.

21. The circuit of claim 19, wherein the compensation network is a first compensation network, the conductor is a first conductor, and the circuit further comprises a second compensation network coupled between the first conductor and a second conductor.

22. The circuit of claim 21, wherein the capacitor is a first capacitor, the resistor is a first resistor, and the second compensation network includes a second capacitor coupled in series with a second resistor between the first and second conductors.

23. The circuit of claim 22, wherein the second compensation network further includes an inductor coupled in series with the second capacitor and the second resistor between the first and second conductors.

24. The circuit of claim 19, wherein the resistor is a first resistor, the conductor is a first conductor, the compensation network is a first compensation network, the capacitor is a first capacitor, and the circuit further comprises a second compensation network coupled between the first conductor and a second conductor,
- wherein the second compensation network includes a second capacitor coupled in series with a second resistor between the first conductor and the second conductor.

25. The circuit of claim 19, wherein the resistor is a first resistor, and the voltage follower includes a second resistor coupled between the output of the second amplifier and the voltage follower output.

26. The circuit of claim 19, wherein the resistor of the injection network is coupled between the capacitor and the inverting input of the second amplifier.

* * * * *